US011404311B2

(12) United States Patent
Peethala et al.

(10) Patent No.: US 11,404,311 B2
(45) Date of Patent: Aug. 2, 2022

(54) METALLIC INTERCONNECT STRUCTURES WITH WRAP AROUND CAPPING LAYERS

(71) Applicant: International Business Machines Corporation, Armonk, NY (US)

(72) Inventors: Cornelius Brown Peethala, Slingerlands, NY (US); Kedari Matam, Albany, NY (US); Chih-Chao Yang, Glenmont, NY (US); Theo Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 16/743,287

(22) Filed: Jan. 15, 2020

(65) Prior Publication Data

US 2020/0152511 A1 May 14, 2020

Related U.S. Application Data

(62) Division of application No. 15/845,734, filed on Dec. 18, 2017, now Pat. No. 10,672,653.

(51) Int. Cl.
*H01L 21/768* (2006.01)
*H01L 23/522* (2006.01)
*H01L 23/532* (2006.01)

(52) U.S. Cl.
CPC .... *H01L 21/76865* (2013.01); *H01L 21/7684* (2013.01); *H01L 21/76802* (2013.01);
(Continued)

(58) Field of Classification Search
CPC ......... H01L 21/76865; H01L 21/76802; H01L 21/76834; H01L 21/7684; H01L 21/76849;
(Continued)

(56) References Cited

U.S. PATENT DOCUMENTS 5,011,580 A 4/1991 Pan et al.
5,236,551 A 8/1993 Pan
(Continued)

FOREIGN PATENT DOCUMENTS

| CN | 103972156 A | 8/2014 |
| EP | 1401015 B1 | 12/2009 |
| WO | 02068717 A1 | 9/2002 |

OTHER PUBLICATIONS

List of IBM Patents or Patent Applications Treated as Related.

*Primary Examiner* — Benjamin Tzu-Hung Liu
(74) *Attorney, Agent, or Firm* — L. Jeffrey Kelly; Ryan, Mason & Lewis, LLP

(57) ABSTRACT

Techniques are provided to fabricate metal interconnects using liner planarization-free process flows. A sacrificial layer is formed on a dielectric layer, and the sacrificial and dielectric layers are patterned to form an opening in the dielectric layer. A conformal liner layer is deposited, and a metal layer deposited to form a metal interconnect in the opening. An overburden portion of the metal layer is planarized to expose an overburden portion of the liner layer. A first wet etch is performed to selectively remove the overburden portion of the liner layer. A second wet etch process is performed to selectively remove the sacrificial layer, resulting in extended portions of the liner layer and the metal interconnect extending above a surface of the dielectric layer. A dielectric capping layer is formed to cover the sidewall and upper surfaces of the extended portions of the liner layer and the metal interconnect.

20 Claims, 5 Drawing Sheets

(52) U.S. Cl.
CPC .. *H01L 21/76834* (2013.01); *H01L 21/76849* (2013.01); *H01L 21/76852* (2013.01); *H01L 21/76856* (2013.01); *H01L 21/76877* (2013.01); *H01L 21/76883* (2013.01); *H01L 23/5226* (2013.01); *H01L 23/5329* (2013.01); *H01L 23/53238* (2013.01)

(58) Field of Classification Search
CPC ......... H01L 21/76852; H01L 21/76856; H01L 21/76877; H01L 21/76883; H01L 23/5226; H01L 23/53238; H01L 23/5329; H01L 21/76885
See application file for complete search history.

(56) References Cited

U.S. PATENT DOCUMENTS

| | | | |
|---|---|---|---|
| 5,238,500 A | 8/1993 | Bergman | |
| 5,656,554 A | 8/1997 | Desai et al. | |
| 6,001,730 A | 12/1999 | Farkas et al. | |
| 6,150,260 A | 11/2000 | Roy | |
| 6,157,081 A | 12/2000 | Nariman et al. | |
| 6,191,040 B1 | 2/2001 | Glass | |
| 6,276,997 B1 | 8/2001 | Li | |
| 6,299,516 B1 | 10/2001 | Tolles | |
| 6,340,601 B1 | 1/2002 | Curran, Jr. et al. | |
| 6,376,335 B1 | 4/2002 | Zhang et al. | |
| 6,435,944 B1 | 8/2002 | Wang et al. | |
| 6,443,814 B1 | 9/2002 | Miller et al. | |
| 6,458,016 B2 | 10/2002 | Merchant et al. | |
| 6,638,326 B2 | 10/2003 | Small et al. | |
| 6,852,136 B2 | 2/2005 | Park et al. | |
| 6,858,540 B2 | 2/2005 | Sun et al. | |
| 6,870,263 B1 | 3/2005 | Clevenger et al. | |
| 6,939,795 B2 | 9/2005 | Eissa et al. | |
| 6,982,227 B2 | 1/2006 | Cooney, III et al. | |
| 7,008,803 B2 | 3/2006 | Kane et al. | |
| 7,052,997 B2 | 5/2006 | Sandhu | |
| 7,323,416 B2 | 1/2008 | Liu et al. | |
| 7,666,781 B2 | 2/2010 | Hsu et al. | |
| 7,745,324 B1 | 6/2010 | Yang et al. | |
| 7,922,824 B2 | 4/2011 | Minsek et al. | |
| 8,779,589 B2 | 7/2014 | Simka et al. | |
| 8,835,326 B2 | 9/2014 | Fitzsimmons et al. | |
| 8,987,859 B2 | 3/2015 | Plekhanov et al. | |
| 9,012,322 B2 | 4/2015 | Duong et al. | |
| 9,040,422 B2 | 5/2015 | Wang et al. | |
| 9,190,285 B1 | 11/2015 | Abdallah et al. | |
| 9,269,612 B2 | 2/2016 | Chen et al. | |
| 9,275,874 B2 | 3/2016 | Tanwar et al. | |
| 9,685,406 B1 | 6/2017 | Briggs et al. | |
| 9,806,023 B1 | 10/2017 | Briggs et al. | |
| 10,002,831 B2 | 6/2018 | Briggs et al. | |
| 10,177,028 B1 | 1/2019 | LiCausi et al. | |
| 10,431,464 B2 | 10/2019 | Yang | |
| 10,741,397 B2 | 8/2020 | Yang | |
| 2002/0119245 A1 | 8/2002 | Verhaverbeke | |
| 2002/0180052 A1 | 12/2002 | Layadi et al. | |
| 2004/0051075 A1 | 3/2004 | Aoki et al. | |
| 2004/0077171 A1 | 4/2004 | Chuang et al. | |
| 2005/0085070 A1 | 4/2005 | Park et al. | |
| 2005/0221604 A1 | 10/2005 | He et al. | |
| 2006/0043590 A1* | 3/2006 | Chen | H01L 23/53295 257/752 |
| 2006/0189134 A1 | 8/2006 | Cotte et al. | |
| 2006/0226122 A1 | 10/2006 | Wojtczak et al. | |
| 2007/0037394 A1 | 2/2007 | Su et al. | |
| 2007/0054489 A1* | 3/2007 | Wong | H01L 21/76885 257/E21.174 |
| 2007/0072417 A1 | 3/2007 | Nakamura et al. | |
| 2007/0117342 A1 | 5/2007 | Chen et al. | |
| 2008/0066860 A1 | 3/2008 | Cotte et al. | |
| 2008/0102599 A1 | 5/2008 | Yang | |
| 2008/0116582 A1* | 5/2008 | Hsu | H01L 21/76883 257/E21.586 |
| 2009/0101864 A1 | 4/2009 | Song et al. | |
| 2009/0200669 A1 | 8/2009 | Yang et al. | |
| 2010/0029078 A1 | 2/2010 | Russell et al. | |
| 2013/0071975 A1 | 3/2013 | Kitano et al. | |
| 2013/0299994 A1 | 11/2013 | Park et al. | |
| 2014/0035141 A1 | 2/2014 | Cheng et al. | |
| 2014/0199832 A1 | 7/2014 | Nguyen et al. | |
| 2015/0093891 A1 | 4/2015 | Zope et al. | |
| 2015/0130065 A1 | 5/2015 | Duong et al. | |
| 2015/0137259 A1 | 5/2015 | Han et al. | |
| 2016/0020087 A1 | 1/2016 | Liu et al. | |
| 2016/0020142 A1 | 1/2016 | Chen et al. | |
| 2016/0049364 A1 | 2/2016 | Edelstein et al. | |
| 2016/0300949 A1 | 10/2016 | Lee et al. | |
| 2017/0345713 A1 | 11/2017 | Chun et al. | |
| 2018/0366324 A1* | 12/2018 | Cao | H01L 21/28255 |
| 2019/0279873 A1 | 9/2019 | Yang | |

\* cited by examiner

100

METALLIC INTERCONNECT STRUCTURES WITH WRAP AROUND CAPPING LAYERS

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias. The BEOL interconnect structure serves to connect various integrated circuit components and devices that are fabricated as part of a front-end-of-line (FEOL) layer of the semiconductor integrated circuit chip. Current state of the art BEOL process technologies typically implement copper to form BEOL interconnect structures, as the low resistivity of copper material significantly reduces resistance in the BEOL interconnect structure, resulting in improved conduction and higher performance. Conventional process flows for fabricating copper interconnect structures utilize a chemical-mechanical planarizing (CMP) process to remove overburden copper material and overburden barrier diffusion liner material from an upper surface of an inter-layer dielectric (ILD) layer in which copper interconnect structures are formed, as well as planarize the upper surface of the ILD layer. The use of CMP to remove overburden barrier diffusion liner material can result in poor quality copper interconnects for various reasons.

For example, due to a non-uniform surface topography, a certain amount of over polish of the ILD layer is required to ensure that all of the overburden barrier diffusion liner material is removed from the surface of the ILD layer so that electrical shorts are avoided in the BEOL interconnect network. The over polishing of the ILD layer also results in removing of an upper portion of the copper metallization formed in the ILD layer, which typically comprises high quality copper material (large metallic grains), while leaving lower quality copper material (smaller metallic grains) in the lower portion of the copper metallization. As such, the resulting copper metallization has increased resistance. Furthermore, the polishing of the surface of the ILD layer results in CMP induced defects at an upper portion of the interface between the barrier diffusion liner layer and the ILD layer, which can provide a conductive path between the copper interconnects and the ILD layer resulting in time dependent dielectric breakdown (TDDB) defects of low-k and ultra low-k ILD layers. As such, the use of CMP in BEOL process flows can lead to increased electrical resistivity and degraded interconnect reliability. Furthermore, the upper surface of a low-k or ultra low-k ILD layer can be damaged (e.g., carbon depletion) due to various processes to which the upper surface of the ILD is subjected such as CMP, plasma pre-cleans, etc., during BEOL process flow, resulting degraded reliability of the ILD layer (e.g., TDDB).

SUMMARY

Embodiments of the invention include methods for fabricating low resistance metal interconnect structures using liner planarization-free process flows. For example, in one embodiment, a method comprises: forming a dielectric layer on a substrate; forming a sacrificial layer on the dielectric layer; patterning the sacrificial layer and the dielectric layer to form an opening in the dielectric layer; forming a conformal liner layer on the sacrificial layer and exposed surfaces within the opening of the dielectric layer; depositing a layer of metallic material to fill the opening with metallic material and form a metallic interconnect structure; performing a chemical-mechanical planarizing process to remove an overburden portion of the layer of metallic material down to an overburden portion of the liner layer on the upper surface of the sacrificial layer; performing a first wet etch process to remove the overburden portion of the liner layer selectively to the sacrificial layer and the metallic interconnect structure; performing a second wet etch process to remove the sacrificial layer selectively to the dielectric layer, the liner layer, and the metallic interconnect structure, wherein removal of the sacrificial layer results in upper portions of the liner layer and the metallic interconnect structure extending above the upper surface of the dielectric layer; and forming a dielectric capping layer on the surface of the dielectric layer, wherein the dielectric capping layer is disposed on sidewall and upper surfaces of the upper portions of the liner layer and the metallic interconnect structure which extend above the upper surface of the dielectric layer.

In another embodiment, a method for fabricating a device comprises: forming an ILD layer on a substrate; forming a sacrificial layer on the ILD layer; patterning the sacrificial layer and the ILD layer to form an opening in the ILD layer; forming a conformal liner layer on the sacrificial layer and exposed surfaces within the opening of the ILD layer; depositing a layer of copper to fill the opening with copper and form a copper interconnect structure; performing a heat treatment to convert a first microstructure of at least a portion of the copper interconnect structure to a second microstructure comprising an average grain size which is greater than an average grain size of the first microstructure; performing a chemical-mechanical planarizing process to remove an overburden portion of the layer of copper down to an overburden portion of the liner layer on the upper surface of the sacrificial layer; performing a first wet etch process to remove the overburden portion of the liner layer selectively to the sacrificial layer and the copper interconnect structure; performing a second wet etch process to remove the sacrificial layer selectively to the dielectric layer, the liner layer, and the copper interconnect structure, wherein removal of the sacrificial layer results in extended portions of the liner layer and the copper interconnect structure extending above the upper surface of the ILD layer; selectively forming a metallic capping layer on exposed upper and sidewall surfaces of the copper interconnect structure; and forming a dielectric capping layer over the surface of the ILD layer and the metallic capping layer, wherein the dielectric capping layer is disposed on sidewall surfaces of the extended portions of the liner layer and the copper interconnect structure.

Another embodiment includes a semiconductor device, which comprises a metallic interconnect structure formed within a dielectric layer, wherein the metallic interconnect structure comprises a metal line, and a liner layer disposed between the metal line and the dielectric layer, and wherein upper portions of the liner layer and the metal line extend above the surface of the dielectric layer. A metallic capping layer is selectively formed on an upper surface and on exposed sidewall surfaces of the upper portion of the metal line which extends above the dielectric layer. A dielectric capping layer is formed on an upper surface of the dielectric layer, on upper and sidewall surfaces of the metallic capping layer, and on exposed sidewall surfaces of the upper portion of the liner layer which extends above the dielectric layer.

Other embodiments will be described in the following detailed description of embodiments, which is to be read in conjunction with the accompanying figures.

BRIEF DESCRIPTION OF THE DRAWINGS

FIGS. 1 through 10 schematically illustrate a method for fabricating a metallic interconnect structure of a semiconductor device, according to an embodiment of the invention, wherein:

FIG. 1 is a schematic cross-sectional side view of a semiconductor device at an intermediate stage of fabrication comprising an ILD layer and a sacrificial layer formed on a substrate;

FIG. 2 is a schematic cross-sectional side view of the semiconductor device of FIG. 1 after patterning the sacrificial layer and the ILD layer to form an opening in the ILD layer, which comprises a via opening and a trench opening;

FIG. 3 is a schematic cross-sectional side view of the semiconductor device of FIG. 2 after depositing a conformal liner layer to line sidewall and bottom surfaces of the opening in the ILD layer with metallic liner material;

FIG. 4 is a schematic cross-sectional side view of the semiconductor device of FIG. 3 after depositing a layer of metallic material to fill the opening in the ILD layer with metallic material;

FIG. 5 is a schematic cross-sectional side view of the semiconductor device of FIG. 4 after applying a heat treatment to the metallic material to convert at least a portion of the metallic material from a polycrystalline microstructure to second microstructure comprising larger grains;

FIG. 6 is a schematic cross-sectional side view of the semiconductor device of FIG. 5 after planarizing the surface of the semiconductor device down to an overburden portion of the liner layer to remove an overburden portion of the layer of metallic material and form a metallic interconnection structure comprising a metal line and underlying metal via;

FIG. 7 is a schematic cross-sectional side view of the semiconductor device of FIG. 6 after selectively removing the overburden portion of the liner layer from the surface of the sacrificial layer;

FIG. 8 is a schematic cross-sectional side view of the semiconductor device of FIG. 7 after selectively removing the sacrificial layer from the surface of the ILD layer;

FIG. 9 is a schematic cross-sectional side view of the semiconductor device of FIG. 8 after selectively forming a metallic capping layer on exposed upper and sidewall surfaces of the metal line of the metal interconnect structure; and FIG. 10 is a schematic cross-sectional side view of the semiconductor device of FIG. 9 after depositing a conformal layer of dielectric material over the surface of the ILD layer to form a dielectric capping layer.

DETAILED DESCRIPTION

Figure 2:
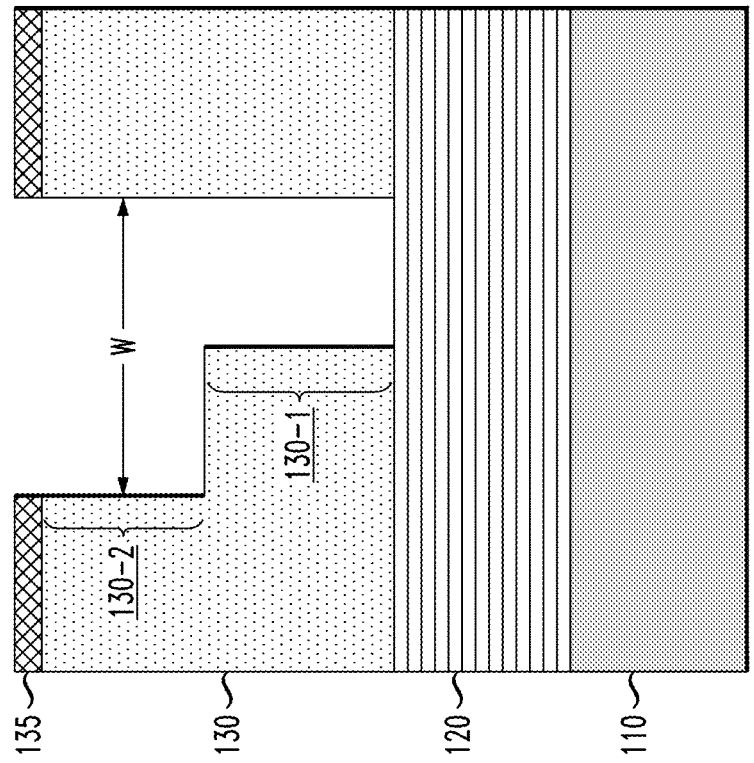

Embodiments will now be described in further detail with regard to methods for fabricating low resistance metal interconnect structures using liner planarization-free process flows, as well as semiconductor devices comprising BEOL interconnect structures that are formed using liner planarization-free process flows. For example, as explained in further detail below, embodiments of the invention utilize a sacrificial layer to protect an upper surface of an ILD layer from damage due to CMP and other fabrication processes, and utilize wet chemical etching (instead of CMP) to selectively remove the sacrificial layer and overburden metallic liner material from field regions of the ILD layer. The use of wet chemical etching to selectively remove the overburden metallic liner material eliminates the need for over polishing and dishing of the metallization structures (e.g., copper metallization), allows large metallic grains to be maintained in upper regions of the metallization structures, and prevents CMP induced defects at an upper portion of the interface between the metallic liner layer and the ILD layer, which can lead to TDDB defects. As such, liner planarization-free process flows according to embodiments of the invention enable the formation of BEOL interconnect structures (e.g., copper interconnect structures) with lower resistivity and enhanced reliability.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
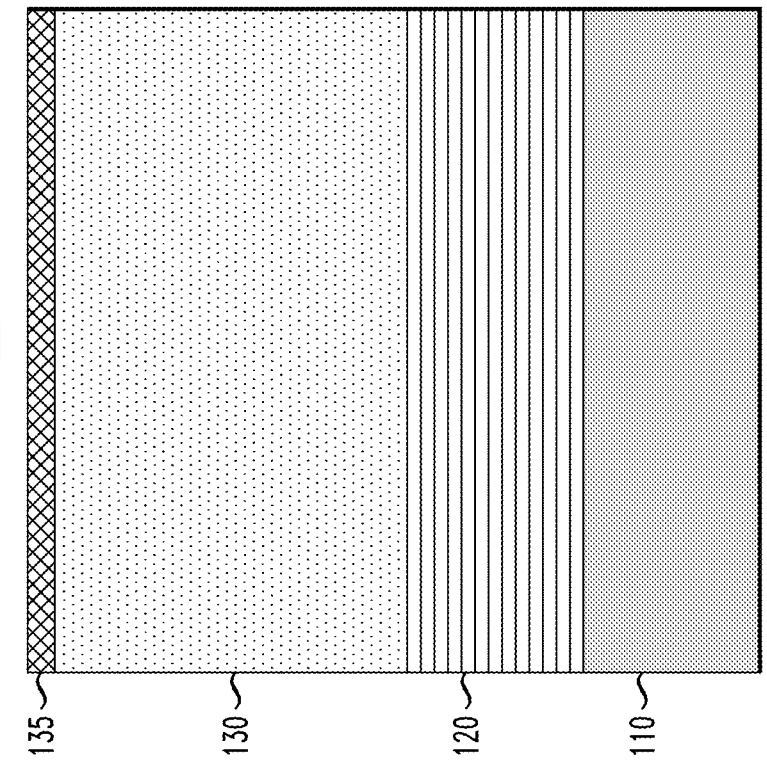

FIGS. 1 through 10 schematically illustrate a method for fabricating a metallic interconnect structure of a semiconductor device, according to an embodiment of the invention. To begin, FIG. 1 is a schematic cross-sectional side view of a semiconductor device 100 at an intermediate stage of fabrication comprising an ILD layer and a sacrificial layer formed on a substrate. In particular, the semiconductor structure shown in FIG. 1 comprises a semiconductor substrate 110 (e.g., semiconductor wafer), a FEOL (front-end-of-line)/MOL (middle-of-line) structure 120 formed on the semiconductor substrate 110, a ILD layer 130, and a sacrificial layer 135 formed on the ILD layer 130. While the semiconductor substrate 110 is illustrated as a generic substrate layer, it is to be understood that the semiconductor substrate 110 may comprise one of different types of semiconductor substrate structures and materials.

For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL/MOL structure 120 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 120.

In the example embodiment of FIG. 1, it is assumed for illustrative purposes that the ILD layer 130 is formed as part of a first interconnect layer of a BEOL interconnect structure. The ILD layer 130 may comprise any suitable dielectric material that is commonly utilized in BEOL process technologies. For example, the ILD layer 130 can be formed of a dielectric material including, but not limited to, silicon oxide (e.g. $SiO_2$), silicon nitride (e.g., $Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The ILD layer 130 may be deposited using known deposition techniques, such as, for example, ALD (atomic layer deposition), CVD (chemical vapor deposition) PECVD (plasma-enhanced CVD), or PVD (physical vapor deposition), or spin-on deposition. The thickness of the ILD layer 130 defines a vertical height (or thickness) of the metallization that is formed within the ILD layer 130, which will vary depending on the application. For example, in one embodiment, the ILD layer 130 is formed with a thickness in a range of about 20 nm to about 800 nm.

The sacrificial layer 135 is formed to cover an upper surface of the ILD layer 130 and protect the upper surface of the ILD layer 130 from exposure to environmental condition during subsequent fabrication process. In one embodiment, the sacrificial layer 135 is formed of a material which can be etched (e.g., wet etched) selective to the material of the ILD layer 130 without causing damage to the upper surface of the ILD layer 130. For example, the sacrificial layer 135 can be formed of materials such as silicon oxide (e.g., $SiO_2$), silicon nitride (e.g., $Si_3N_4$), silicon carbide (SiC), or combination of the same. The sacrificial layer 135 is formed with a thickness in a range of about 1 nm to about 50 nm.

FIG. 2 is a schematic cross-sectional side view of the semiconductor device of FIG. 1 after patterning the sacrificial layer 135 and the ILD layer 130 to form an opening 130-1/130-2 in the ILD layer 130. In the example embodiment of FIG. 2, the opening 130-1/130-2 comprises a via opening 130-1 and a trench opening 130-2. The trench opening 130-2 is formed with a width W, which defines a "critical dimension" (CD) of metal wiring which is subsequently formed by filling the trench opening 130-2 with metallic material (the width W is fixed by the CD of the particular fabrication process that is implemented). The ILD layer 130 can be patterned using known lithographic to form the opening 130-1/130-2.

The example embodiment of FIG. 2 illustrates one method for patterning the via opening 130-1 and the trench opening 130-2 in a single layer of dielectric material (i.e., the ILD layer 130) using one of various "dual" damascene patterning techniques known in the art. In particular, such dual damascene techniques generally include a "via first" process, a "trench first" process, and a "buried via" process, which comprises different sequences for etching the first ILD layer 130 to pattern the via opening 130-1 and trench opening 130-2, but where each type of dual damascene process results in the semiconductor structure shown in FIG. 2. In other embodiments, single damascene techniques can be utilized to form the structure shown in FIG. 2. In particular, with a single damascene process, metal vias and metal lines are separately formed in different ILD layers. The damascene patterning can be implemented using any conventional lithography and etching process, e.g., forming an etch mask and etching the dielectric material of the ILD layer 130 using a dry etch process such as RIE (reactive ion etching), etc.

Figure 3:
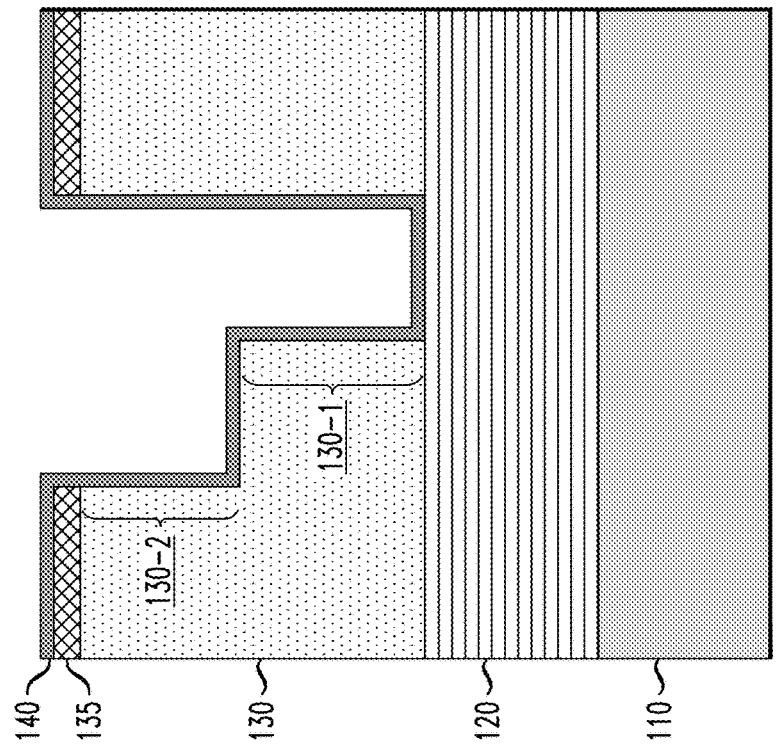

Next, FIG. 3 is a schematic cross-sectional side view of the semiconductor device of FIG. 2 after depositing a conformal liner layer 140 to line the sidewall and bottom surfaces of the opening 130-1/130-2 in the ILD layer 130 with metallic liner material. The conformal liner layer 140 serves as barrier diffusion layer and as an adhesion layer (or seed layer) with regard to the metallic material (e.g., copper material) which is subsequently deposited to fill the opening 130-1/130-2 in the ILD layer 130 and form a metallic interconnect structure (e.g., metal line and via). The liner layer 140 may be formed any type of metallic liner materials which are suitable for the given application including, but not limited to titanium (Ti), titanium nitride (TiN), tantalum (Ta), tantalum nitride (TaN), cobalt (Co), ruthenium (Ru), tungsten (W), iridium (Ir), rhodium (Rh), manganese (Mn), or nickel (Ni), or multiple layers and/or combinations of such metallic materials. In one embodiment, the liner layer 140 comprises one or more conformal layers of metallic material having thickness in a range of about 1 nm to about 100 nm.

Figure 4:
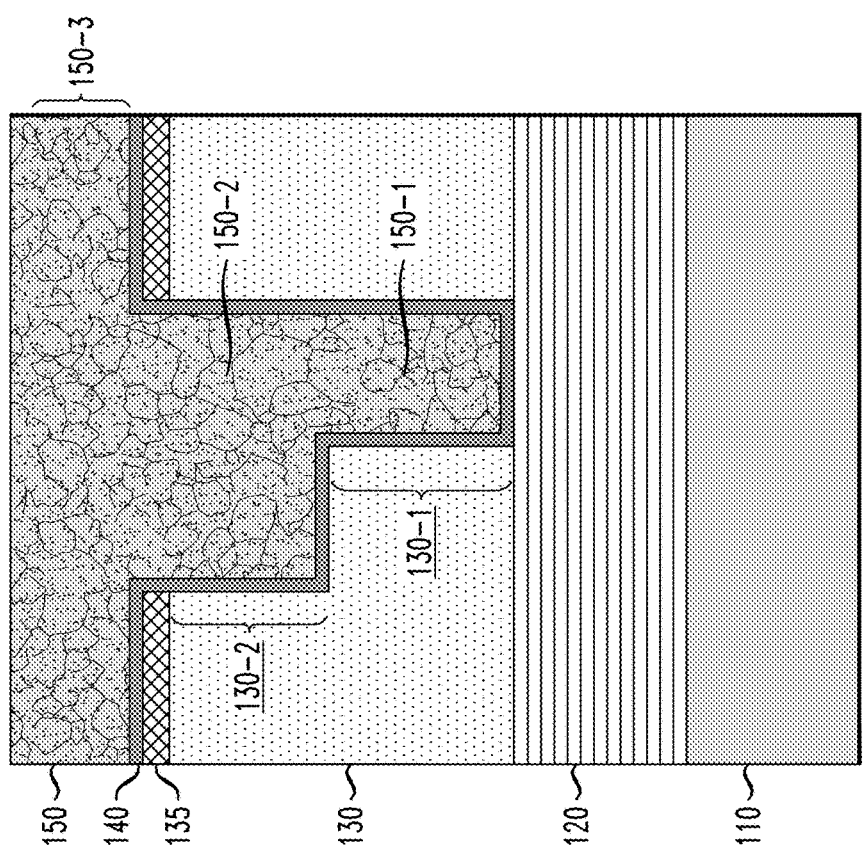

FIG. 4 is a schematic cross-sectional side view of the semiconductor device of FIG. 3 after depositing a layer of metallic material 150 to fill the opening 130-1/130-2 in the ILD layer 130 with metallic material. As depicted in FIG. 4, the metallic material within the via opening 130-1 comprises a metal via 150-1, the metallic material within the trench opening 150-2 comprises a metal wire 150-2, and the metallic material disposed over the surface of the ILD layer 130 comprises overburden metallic material 150-3 which is subsequently removed. In one embodiment of the invention, the layer of metallic material 150 comprises copper (Cu). In other embodiments, the metallic material 150 can be, for example, Al, W, Co, Ru, Ir, Rh, Ni, or alloys thereof. The layer of metallic material 150 is deposited using known techniques such as electroplating, electroless plating, CVD, PVD, or a combination of methods.

In an exemplary embodiment where the metallic material 150 comprises electroplated copper, the copper metallic material 150 as deposited comprises a polycrystalline microstructure, as schematically illustrated in FIG. 4. The polycrystalline microstructure comprises a mosaic of small crystallites (or grains) of varying size and randomly distributed with no preferred orientation (i.e., random texture and no grain direction). The polycrystalline microstructure comprises many grain boundaries, which tends to decrease the electrical conductivity of the metallic material, and tends to enhance electromigration due to grain boundary diffusion of electrons, which is not desirable. Accordingly, to further reduce the electrical resistance of the metal wiring, the metallic material 150 is subjected to a heat treatment to convert the polycrystalline microstructure of the metallic material 150 into a different microstructure comprising larger grains with a given grain direction. For example, in one embodiment, the polycrystalline microstructure is converted into a "bamboo" or "columnar" microstructure, having large elongated grains that extend in a particular direction.

Figure 5:
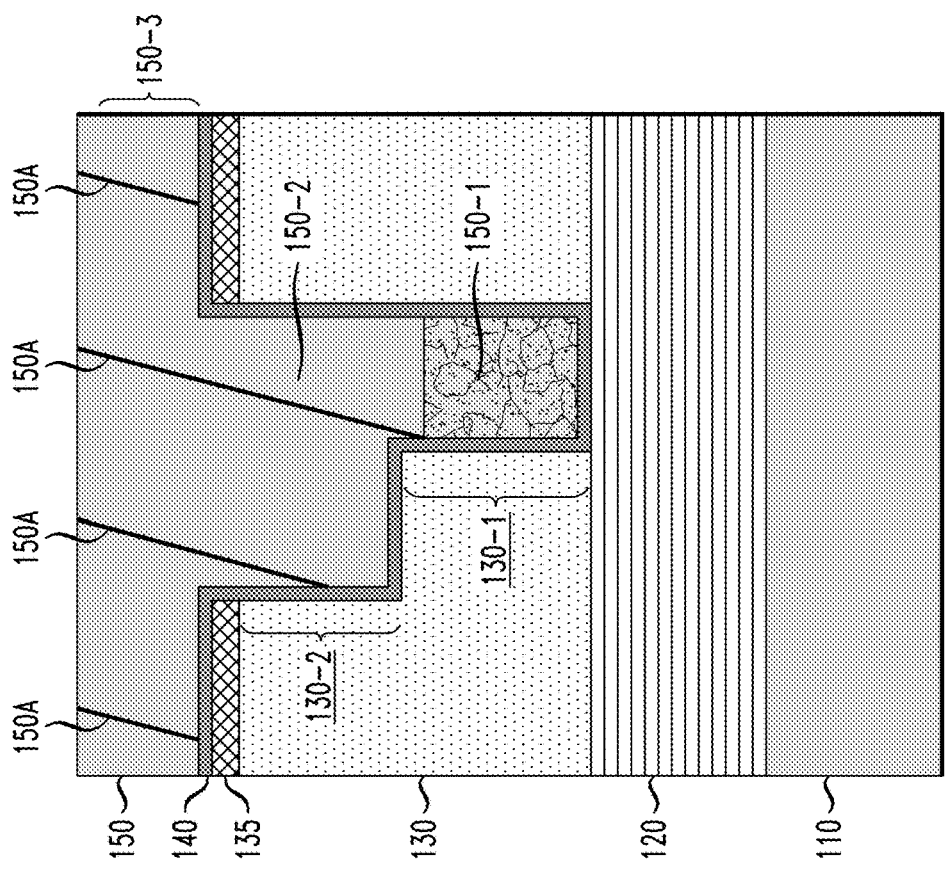

For example, FIG. 5 is a schematic cross-sectional side view of the semiconductor device of FIG. 4 after applying a heat treatment to the metallic material 150 to convert at least a portion of the metallic material 150 from a polycrystalline microstructure to second microstructure comprising larger grains that are defined by grain boundaries 150A. In one embodiment, the second microstructure comprises a columnar or bamboo microstructure. In particular, in one example embodiment of the invention as shown in FIG. 5, the heat treatment is applied to convert the microstructure of the overburden metallic material 150-3 and at least the metallic material 150-2 disposed within the trench opening 130-2 from a polycrystalline microstructure (as shown in FIG. 4) to a larger grain or bamboo microstructure as schematically shown in FIG. 5, while the microstructure of the metallic material 150-1 within the via opening 150-1 remains substantially polycrystalline.

As specifically shown in FIG. 5, the overburden metallic material 150-3 and the portion of the metallic material 150-2 (which forms a metal line) within the trench opening 130-2 comprises large grains that are separated by grain boundaries 150A which extend in substantially the same direction (e.g., in a substantially vertical direction), providing a columnar or bamboo microstructure. This microstructure serves to minimize electromigration as the grain boundaries 150A extend in a substantially vertical direction which is essentially perpendicular to the current flow along the "length" direction of the metal line 150-2 (perpendicular to the width W).

In one embodiment, as shown in FIG. 5, an average grain size of the microstructure of the metallic line material 150-2 in the trench 130-2 is greater than an average size of the polycrystalline microstructure of the metallic material 150-1 in the via opening 130-1. It is to be understood that the term "average grain size" as used herein is a well-known term of art, which denotes a parameter that can be estimated using known techniques. For example, one technique for estimating the average grain size of a given material is known as the "intercept" method. With this method, a straight line of a given length (L) is drawn through a micrograph of the crystal structure of the given material (e.g., a TEM (Transmission Electron Microscope) or STEM (Scanning Transmission Electron Microscope) microstructure image). The number of grains (N) that the straight line intersects is counted. The average grain size is then determined as (L)/(N).

In another embodiment of the invention, the average grain size of the metallic material 150-2 (which forms the metal line) in the trench 130-2 in the "length" direction of the trench 130-2 (perpendicular to width W) is greater than a critical dimension (e.g., width W) of the metal line 150-2.

The heat treatment that is used to convert the polycrystalline microstructure of the metallic material 150 to a second microstructure comprising larger grains (e.g., columnar or bamboo microstructure) can be implemented using various techniques. For example, in one embodiment of the invention, the semiconductor structure of FIG. 5 can be placed in a furnace and subjected to a thermal anneal process in a temperature range of about 100 degrees Celsius to about 500 degrees Celsius for a period of about 20 minutes to about three hours. In another embodiment, a laser process can be implemented using known methods in which a laser beam (e.g., pulsed beam) is directed at the surface of the metallic material 150 to heat the metallic material 150 to a temperature which effectively causes a thermal anneal of the metallic material 150 and thus, a conversion of the polycrystalline microstructure to a second microstructure comprising larger grains (e.g., columnar or bamboo microstructure). A laser process can heat the metallic material 150 to a relatively high temperature (e.g., in a range of 200~1000 degrees Celsius) in a short time frame (e.g., 10 nanoseconds to about 5 minutes). In this regard, the use of a laser process to heat treat the metallic material 150 provides precise temperature control of the metallic material 150, while reducing potential thermal damage to surrounding features/components of the semiconductor structure when laser processing the metallic material 150.

Figure 6:
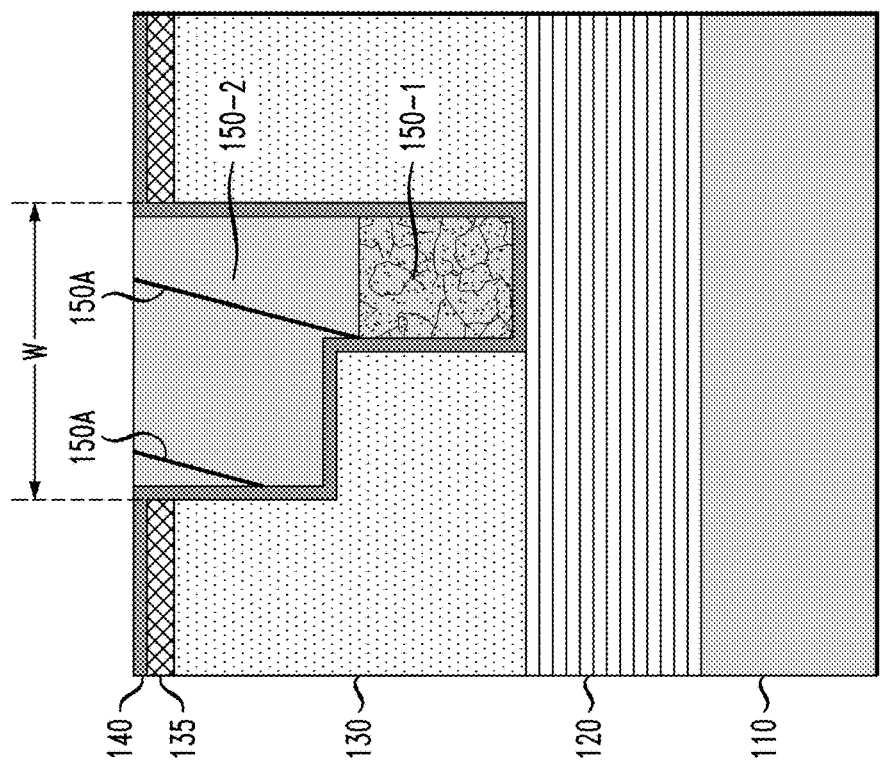
Figure 8:
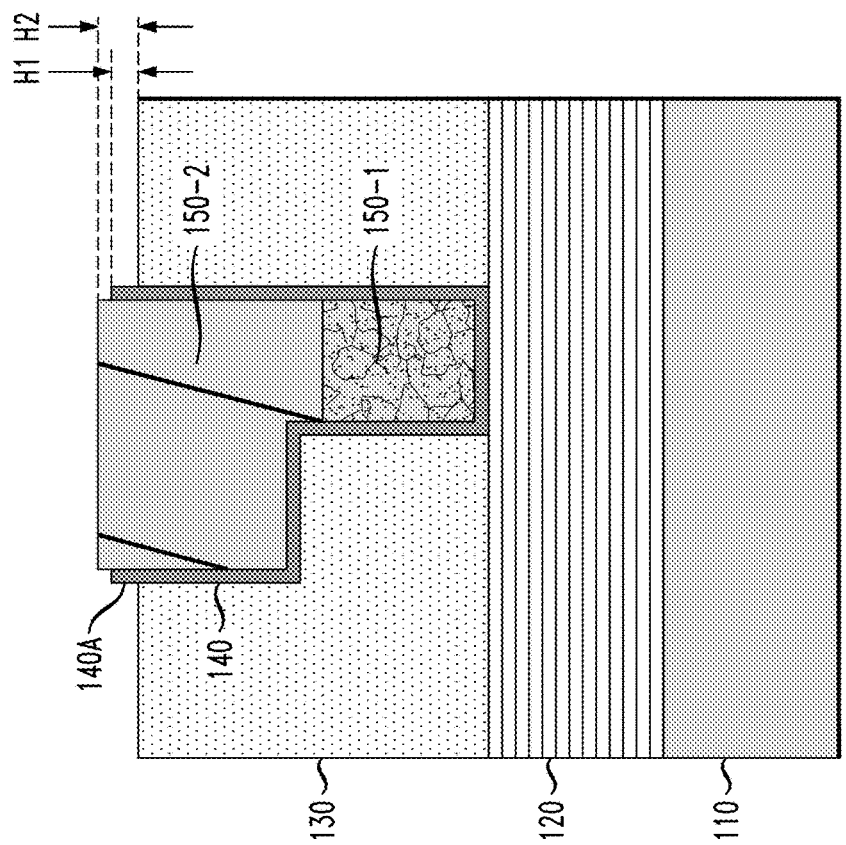
Figure 7:
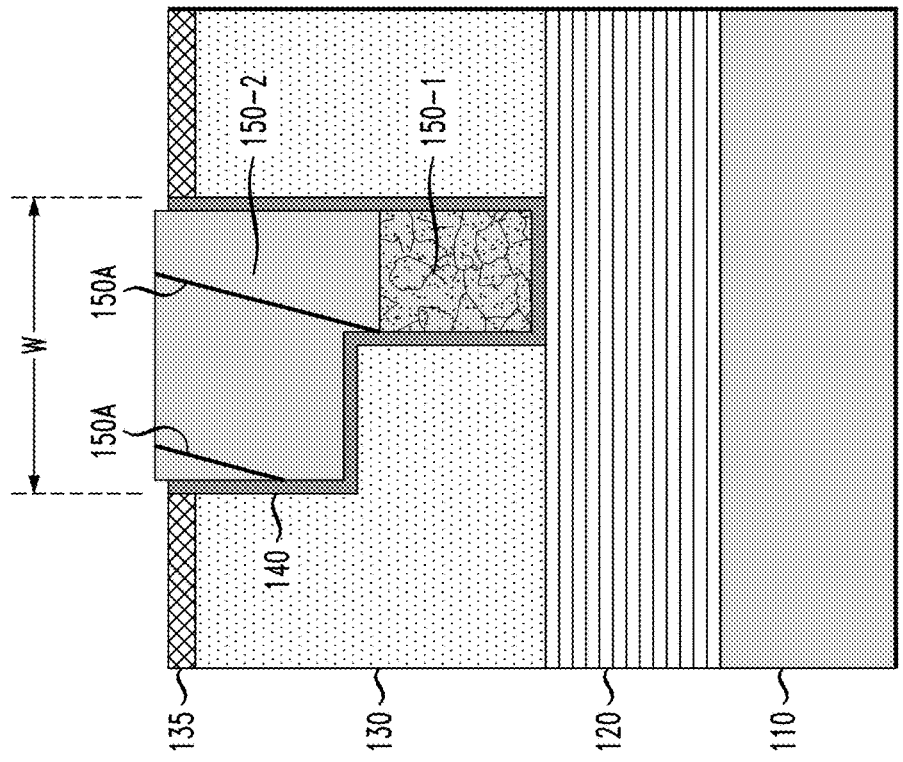

A next phase of the fabrication process comprises removing the overburden metallic material 150-3, the overburden portion of the layer of liner material 140, and the sacrificial layer 135 from the upper surface of the ILD layer 130 using a process flow as schematically illustrated in FIGS. 6, 7, and 8. In particular, FIG. 6 is a schematic cross-sectional side view of the semiconductor device of FIG. 5 after planarizing the surface of the semiconductor device down to an overburden portion of the liner layer 140 to remove the overburden portion of the layer of metallic material 150. In one embodiment, a CMP process is performed to remove the overburden metallic material 150-3 while terminating the CMP process when reaching the upper surface of the overburden portion of the liner layer 140. The CMP process results in the formation of a metal interconnect structure comprising the metal via 150-1 and the metal line 150-2, as schematically shown in FIG. 6.

This is in contrast to conventional BEOL process flows where, as noted above, the CMP process would continue to remove the overburden portion of the liner layer 140 and over polish the surface of the semiconductor structure to remove an upper portion of the ILD layer 130 and an upper metal line portion of the metal interconnect structure to ensure that the overburden portion of the liner layer 140 is removed. With the conventional process, a portion of the low-resistivity metallic material (large grain metallic material) in the upper region of the metal line 150-2 of the metal interconnect structure would be removed, thereby resulting in the formation of a metal line with higher resistance (e.g., smaller cross-sectional area with a higher ratio of polycrystalline metallic material to the large grain metallic material).

In accordance with embodiments of the invention, the overburden portion of the liner layer 140 is selectively removed using a wet chemical etching process. In one embodiment, the wet chemical etching process comprises a mixture of acids and chemical compounds such as hydrogen fluoride, hydrogen chloride, nitric acid, sulfuric acid, and other suitable wet etch solutions. In one embodiment, the liner layer 140 can be removed using methods disclosed in U.S. patent application Ser. No. 15/295,250, filed on Oct. 17, 2016, entitled "Liner Planarization-Free Process for Fabricating Metallic Interconnect Structures, which is commonly assigned and incorporated herein by reference. For example, as an initial step in this process, a controlled surface treatment is applied to convert the metallic material of the overburden portion of the liner layer 140 into a metal nitride material. In one particular embodiment, the controlled surface treatment comprises a nitridation process which serves to infuse nitrogen (N) atoms into the overburden metallic material of the liner layer 140 to form a metal nitride material. For example, when the liner layer 140 is formed of Ti, the overburden portion of the liner layer 140 is converted into a layer of TiN. Similarly, when the liner layer 140 is formed of, e.g., Ta or W, the overburden portion of the liner layer 140 is converted into TaN or WN, respectively.

The controlled surface treatment can be implemented using various plasma nitridation methods. In general, for a plasma treatment process, a plasma can be generated using a precursor gas which comprises nitrogen (e.g., $N_2$, $NH_3$, $N_2H_2$, or mixtures thereof, etc.) in an inert atmosphere of He or Ar. In addition, in one embodiment, the plasma treatment is performed in a suitable chamber at a temperature in a range of about 80 degrees Celsius to about 900 degrees Celsius, with a plasma energy that is suitable to perform the surface treatment to a target depth.

In other embodiments, the controlled surface treatment can be implemented using a gas cluster ion beam (GCIB) process, or a neutral atom beam (NAB) technique. In general, these surface treatment techniques involve a bombardment process in which the overburden portion of the liner layer 140 is bombarded with high energy particles to convert the metallic material of the overburden portion of the liner layer 140 into a metal nitride material. The GCIB and NAB treatment methods are technologies that enable nano-scale modification of surfaces, e.g., chemically alter surfaces through infusion. In particular, with GCIB, the overburden portion of the liner layer 140 is bombarded by a beam of high energy nanoscale cluster ions, which are formed when a high-pressure gas (e.g., 10 atmospheres pressure) expands into a vacuum. In one example embodiment, a GCIB treatment can be implemented with a suitable mixture of gases (as noted above), in temperature range of about 80 degrees Celsius to about 900 degrees Celsius, and an energy in a range of about 10 keV to about 30 keV to chemically infuse nitrogen atoms into the metallic material of the overburden portion of the liner layer 140 at a controlled penetration depth of less than about 10 nm, and thereby form a metal nitride layer.

Similarly, a NAB surface treatment enables ultra-shallow processing of surfaces by converting energized gas cluster ions produced by a GCIB method into intense collimated beams of coincident neutral gas atoms having controllable average energies from about 10 eV per atom to about 100 eV per atom. An electrostatic deflector is used to eliminate charged species in the environment, while allowing the released neutral atoms to bombard the surface of the overburden portion of the liner layer 140 and produce effects similar to those normally associated with GCIB, but to shallower controlled penetration depths (e.g., about 3 nm or less). The type of plasma process utilized will depend, for example, on the thickness of the overburden portion of the liner layer 140 so that sufficient penetration depths are achieved to convert the entire thickness of the overburden portion of the liner layer 140 to a metal nitride material.

Following completion of the controlled surface treatment, the overburden portion of the liner layer 140 (which has been converted to a metal nitride layer) disposed on the surface of the ILD layer 140 is selectively removed using a wet etch process. In particular, FIG. 7 is a schematic cross-sectional side view of the semiconductor device of FIG. 6 after selectively removing the overburden portion of the liner layer 140 from the surface of the sacrificial layer 150 without removing or damaging the surface of the ILD layer 130 or the metallic material of the metal line 150-2. In one embodiment, the overburden portion of the liner layer 140 (e.g., TiN), which has been treated, is removed selective to the non-treated metallic material of the liner layer 140 (e.g., Ti) using a wet etch process with an etch chemistry comprising a mixture of hydrogen peroxide ($H_2O_2$) and an acid. For example, the acid may comprise at least one of hydrofluoric acid (HF), hydrochloric acid (HCl), sulfuric acid ($H_2SO_4$), peroxynitric acid ($HNO_4$), or other suitable acids, etc.

Next, FIG. 8 is a schematic cross-sectional side view of the semiconductor device of FIG. 7 after selectively removing the sacrificial layer 135 from the surface of the ILD layer 130 without removing or damaging any dielectric material of the ILD layer 130 or any metallic material of the metal line 150-2. In one embodiment, the sacrificial layer 135 is removed using a wet etch process with an etch solution that is configured to etch the material of the sacrificial layer 135 selective to the materials of the ILD layer 130 and the metal line 150-2. For example, the sacrificial layer 135 can be wet etched using dilute hydrogen fluoride (HF) or other suitable wet etch solutions.

The wet etch removal of the overburden portion of the liner layer 140 and the sacrificial layer 135 eliminates the need to use CMP to remove the overburden portion of the liner layer 140, and thereby avoids removal or damage of the upper portions of the ILD layer 130 and the metal line 150-2 as which occurs in conventional methods in which CMP is used to over polish the surface of the semiconductor structure to ensure removal of the overburden metallic material of the liner layer 140. Indeed, as shown in FIG. 8, after the overburden portion of the liner layer 140 and the sacrificial layer 135 are etched away, upper portions 140A of the liner layer 140 extend above the upper surface of the ILD layer 130 by a height H1, and an upper surface of the metal line 150-2 of the metal interconnect structure extends above the surface of the ILD layer 130 at a height H2. In one embodiment, the height H1 is substantially equal to a thickness of the sacrificial layer 135, and the height H2 is in a range of about 1 nm to about 10 nm. This is in contrast to conventional methods in which CMP is utilized to remove the overburden materials of the liner layer 140 and metallic layer 150 and over polish the ILD layer 130, wherein the upper surface of the metal line 150-2 would be either level with the planarized surface of the ILD layer 130 or recessed/dished below the surface of the ILD layer 130.

Figure 9:
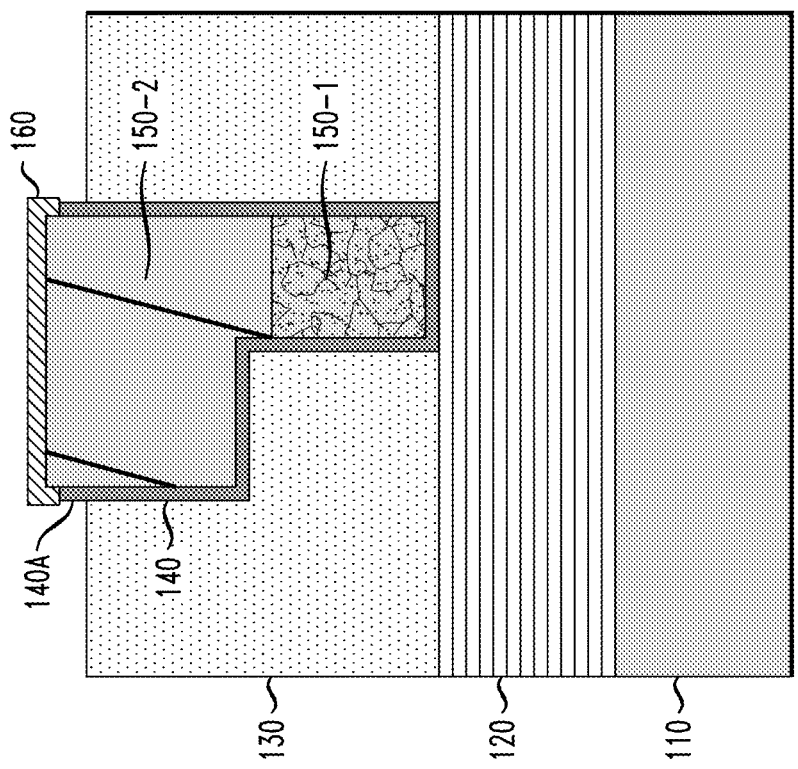

Following removal of the sacrificial layer 135, the process flow continues with forming a first capping layer on exposed surfaces of the metal line 150-2. In particular, FIG. 9 is a schematic cross-sectional side view of the semiconductor device of FIG. 8 after selectively forming a metallic capping layer 160 on the exposed upper and sidewall surfaces of the metal line 150-2 of the metal interconnect structure. In one embodiment of the invention, the metallic capping layer 160 is formed by selectively depositing a layer of metallic material such that the metallic material is deposited on the exposed upper and sidewall surfaces of the metal line 150-2 and not on the upper surface of the ILD layer 130 or on exposed sidewall surfaces of the upper portions 140A of the liner layer 140. The metallic capping layer 160 can be formed with any suitable metallic material including, but not limited to, Co, Mn, Al, Ru, Ti, and Ni. The metallic capping layer 160 can be deposited on the exposed surfaces of the metal line 150-2 selective to the ILD layer 130 using known deposition techniques such as ALD, CVD, or electroless deposition.

Figure 10:
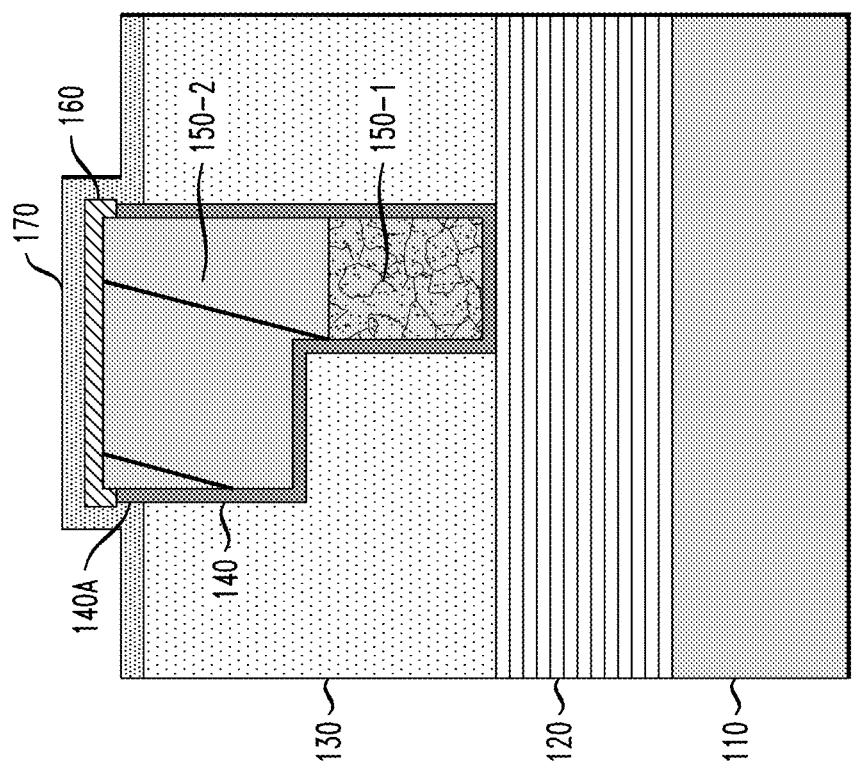

Following formation of the metallic capping layer 160, a second capping layer is formed to cover an entire upper surface of the BEOL structure. In particular, FIG. 10 is a schematic cross-sectional side view of the semiconductor device of FIG. 9 after depositing a conformal layer of dielectric material over the surface of the BEOL structure to form a dielectric capping layer 170. As shown in FIG. 10, the dielectric capping layer 170 wraps around the upper and sidewall surfaces of the portion of the metal line 150-2 which extends above the ILD layer 130. The dielectric capping layer 170 is formed of a dielectric material which is non-reactive with the metallic material of the metal line 150-2 and other metal interconnect structures that are formed in the same ILD layer 130 and in a next upper metallization level of the BEOL structure. The capping 170 layer serves to insulate exposed surface portions of the metallization structures formed in the ILD layer 130 from the dielectric material of another ILD layer (second interconnect level) formed on top of the ILD layer 130. For example, in a BEOL structure using copper metallization, the dielectric capping layer 170 serves to improve interconnect reliability by preventing oxidation of the copper metallization and preventing copper material of the metallization structures from diffusing into the dielectric material of the ILD layers.

The dielectric capping layer 170 could be formed of silicon nitride (SiN), silicon carbide (SiC), silicon carbon nitride (SiCN), hydrogenated silicon carbide (SiCH), a silicon-boron-carbon-nitride ceramic (SiBCN), silicon-oxygen-carbon-nitride (SiOCN), or a multilayer stack comprising the same or different types of dielectric materials, etc., and deposited using standard deposition techniques, for example, chemical vapor deposition. The capping layer 170 can be formed with a thickness in a range from about 2 nm to about 60 nm.

The process flow of FIGS. 1 through 10 can be repeated to form one or more additional interconnect levels above the ILD layer 130 shown in FIG. 10 to construct a BEOL layer. The process flows described herein for fabricating metal interconnect structures allow for the fabrication of metal lines with large grain structures with reduced resistivity, while eliminating the need for using CMP to over polish the ILD layers and metallization structures at each interconnect level to remove overburden liner material from the field regions during BEOL fabrication. The CMP-free removal of the overburden metallic material of the liner layers protects the ILD layers from dielectric damage due to CMP, as well as prevents dishing/recess of the upper surface of the metallization structures due to CMP, as in conventional methods discussed above.

It is to be understood that the methods discussed herein for fabricating metallic interconnect structures (e.g., copper BEOL interconnect structures) can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device, comprising:
a metallic interconnect structure formed within a dielectric layer, wherein the metallic interconnect structure comprises a metal line, and a liner layer disposed between the metal line and the dielectric layer, wherein upper portions of the liner layer and the metal line extend above an upper surface of the dielectric layer, wherein the upper portion of the liner layer extends above the upper surface of the dielectric layer by a first height, and wherein the upper portion of the metal line extends above the upper surface of the dielectric layer by a second height which is greater than the first height;
a metallic capping layer selectively formed on an upper surface and on sidewall surfaces of the upper portion of the metal line which extends above the upper portion of the liner layer; and
a dielectric capping layer formed on the upper surface of the dielectric layer, on upper and sidewall surfaces of the metallic capping layer, and on sidewall surfaces of the upper portion of the liner layer which extends above the upper surface of the dielectric layer.

2. The device of claim 1, wherein the metal line comprises copper.

3. The device of claim 1, wherein the metallic capping layer comprises cobalt.

4. The device of claim 1, wherein the liner layer comprises at least one of tantalum, cobalt, ruthenium, iridium, rhodium, manganese, and nickel.

5. The device of claim 1, wherein the dielectric layer comprises an interlayer dielectric layer of a back-end-of-line structure.

6. The device of claim 1, wherein the dielectric capping layer comprises a conformal layer of silicon-oxygen-carbon-nitride.

7. The device of claim 1, wherein the dielectric capping layer comprises a conformal layer of at least one of: silicon nitride, silicon carbide, silicon carbon nitride, hydrogenated silicon carbide, and a silicon-boron-carbon-nitride ceramic.

8. The device of claim 1, wherein the dielectric capping layer comprise a thickness in a range of about 2 nm to about 60 nm.

9. The device of claim 1, wherein the first height is in a range of about 1 nm to about 50 nm.

10. The device of claim 1, wherein the metallic interconnect structure comprises a columnar microstructure.

11. The device of claim 1, wherein the metal line comprises a columnar microstructure.

12. The device of claim 11, wherein the metallic interconnect structure comprises a dual damascene structure with a metallic via disposed below the metal line.

13. A semiconductor device, comprising:
a metallic interconnect structure formed within a dielectric layer, wherein the metallic interconnect structure comprises a metal line, and a liner layer disposed between the metal line and the dielectric layer, and wherein upper portions of the liner layer and the metal line extend above an upper surface of the dielectric layer;
a metallic capping layer selectively formed on an upper surface and on sidewall surfaces of the upper portion of the metal line which extends above the upper surface of the dielectric layer; and
a dielectric capping layer formed on the upper surface of the dielectric layer, on upper and sidewall surfaces of the metallic capping layer, and on sidewall surfaces of the upper portion of the liner layer which extends above the upper surface of the dielectric layer;
wherein the metallic interconnect structure comprises a dual damascene structure comprising a metallic via disposed below the metal line;
wherein the metal line comprises a columnar microstructure; and
wherein at least a portion of the metallic via comprises a polycrystalline microstructure.

14. The device of claim 13, wherein:
the metal line comprises copper;
the metallic capping layer comprises cobalt; and
the liner layer comprises at least one of tantalum, cobalt, ruthenium, iridium, rhodium, manganese, and nickel.

15. A semiconductor device, comprising:
a copper interconnect structure formed within an interlayer dielectric layer of a back-end-of-line structure, wherein the copper interconnect structure comprises a dual damascene structure comprising a copper metal line and copper via, and a liner layer disposed between the copper interconnect structure and the interlayer dielectric layer, wherein upper portions of the liner layer and the copper metal line extend above an upper surface of the interlayer dielectric layer, wherein the upper portion of the liner layer extends above the upper surface of the interlayer dielectric layer by a first height, and wherein the upper portion of the copper metal line extends above the upper surface of the interlayer dielectric layer by a second height which is greater than the first height;
a metallic capping layer selectively formed on an upper surface and on sidewall surfaces of the upper portion of the copper metal line which extends above the upper portion of the liner layer; and
a dielectric capping layer formed on the upper surface of the interlayer dielectric layer, on upper and sidewall surfaces of the metallic capping layer, and on sidewall surfaces of the upper portion of the liner layer which extends above the upper surface of the interlayer dielectric layer.

16. The device of claim 15, wherein the metallic capping layer comprises cobalt.

17. The device of claim 15, wherein the liner layer comprises at least one of tantalum, cobalt, ruthenium, iridium, rhodium, manganese, and nickel.

18. The device of claim 15, wherein the dielectric capping layer comprises a conformal layer of at least one of: silicon-oxygen-carbon-nitride, silicon nitride, silicon carbide, silicon carbon nitride, hydrogenated silicon carbide, and a silicon-boron-carbon-nitride ceramic.

19. The device of claim 15, wherein the dielectric capping layer comprises a thickness in a range of about 2 nm to about 60 nm.

20. The device of claim 15, wherein the first height is in a range of about 1 nm to about 50 nm.

* * * * *